United States Patent [19]

Pinzone

[11] Patent Number: 5,685,904
[45] Date of Patent: Nov. 11, 1997

[54] METHOD OF MAKING MULTI-QUANTUM WELL LASERS

[75] Inventor: Christopher James Pinzone, Basking Ridge, N.J.

[73] Assignee: Lucent Technologies Inc., Murray Hill, N.J.

[21] Appl. No.: 430,658

[22] Filed: Apr. 28, 1995

[51] Int. Cl.$^6$ ................................................ C30B 25/02
[52] U.S. Cl. ............................ 117/89; 117/93; 117/102
[58] Field of Search ............................ 117/89, 93, 102

[56] References Cited

U.S. PATENT DOCUMENTS

| | | | |
|---|---|---|---|
| 3,721,583 | 3/1973 | Blakeslee | 117/89 |
| 3,930,908 | 1/1976 | Jolly | 117/102 |
| 4,629,532 | 12/1986 | Yanase et al. | 117/102 |
| 4,664,743 | 5/1987 | Moss et al. | 117/102 |
| 5,338,389 | 8/1994 | Nishizawa et al. | 117/89 |

FOREIGN PATENT DOCUMENTS

| | | | |
|---|---|---|---|
| 94614 | 4/1989 | Japan | 117/102 |
| 5007053 | 1/1993 | Japan . | |
| 5055697 | 3/1993 | Japan . | |
| 335241 | 12/1993 | Japan | 117/102 |
| 232052 | 8/1994 | Japan | 117/89 |

OTHER PUBLICATIONS

V. Swaminathan et al., *Material Aspects of GaAs and InP Based Substrates*, 1991, pp. 131–133.

Primary Examiner—Robert Kunemund
Attorney, Agent, or Firm—John M. Harman

[57] ABSTRACT

The present invention is a method for making multi-quantum well structures having superior interfacial crystalline quality. In particular, it is an LP-MOCVD crystal growth method using continuous growth stages to produce well-defined heterojunctions of uniform thickness for multi-quantum well (MQW) lasers, including MQW lasers structures having output wavelengths less than approximately 1.55 μm. The continuous growth stages are characterized by essentially instantaneous gas switching sequences from a first gaseous mixture used to grow separate confinement layers (SCL) and barrier layers to a second gaseous mixture used to grow quantum well layers. By continuous growth stages it is meant that there is no intentional pause between well and barrier layer growth stages, that is, the gaseous mixture used for a particular growth stage is introduced into the LP-MOCVD reactor just as the last of the previous gaseous mixture is venting out of the reactor. Surprisingly, it appears that the continuous growth stages of the present invention decrease the pressure transients that exist during gas switching sequences in conventional LP-MOCVD methods, thereby minimizing if not eliminating all lateral thickness modulation in the well and barrier layers by suppressing the tendency for the growth to proceed in a three dimensional manner.

18 Claims, 5 Drawing Sheets

METHOD OF MAKING MULTI-QUANTUM WELL LASERS

BACKGROUND OF THE INVENTION

1. Field of the Invention

The present invention relates to the growth of alloy heterostructures as it applies to the manufacture of electronic and photonic devices made from compound semiconductors. More particularly, but not by way of limitation, the present invention relates to epitaxial growth of alloy heterostructures used in the manufacture of multi-quantum well (MQW) lasers.

2. Description of the Related Art

The manufacture of high performance electronic and photonic devices made from compound semiconductors, such as heterojunction lasers and bipolar transistors, requires epitaxial growth of layers to form alloy heterostructures with sharply defined metallurgical interfaces. The interfaces between various layers within the devices form heterojunctions that can behave as optical cavities for transmission of amplified light occurring in response to electron current flowing across the heterojunction. The waves of the amplified light propagate along the plane of the heterojunction while reflecting back and forth at the interfaces defining the heterojunction. Thus, it is crucial to the coherency of the light and the consistency of its output wavelength to have heterojunctions with uniform thickness and well-defined heterojunction interfaces.

In fabricating such devices, each individual semiconductor layer is grown epitaxially using a crystal growth technique. One of the best known crystal growth techniques is low pressure metalorganic chemical vapor deposition (LP-MOCVD). In this method, source gases such as metal alkyls and hydrides are mixed with various compounds and pyrolized in a hydrogen atmosphere to grow thin single crystals of semiconductor material upon a substrate. Specifically, a first growth stage is initiated when a first gaseous mixture, including source gases, is introduced into the LP-MOCVD reactor and completed when the thin single crystal is grown. After the first growth stage, a brief interval follows to allow the gases from the first growth stage to clear out of the reactor and to ready the second gaseous mixture. Then, the second growth stage is initiated by introducing the second gaseous mixture into the reactor for growth of the next thin crystal layer. The growth stages are repeated in this manner until the desired heterostructure is grown. In some LP-MOCVD growth techniques, additional growth stages are conducted before the growth stages are repeated.

In producing semiconductor devices such as multi-quantum well (MQW) lasers, the heterostructure is grown so that a plurality of active material well layers are bound on either side by barrier layers thereby defining a plurality of active well regions. Also, a pair of separate confinement layers (SCL) binds the plurality of interleaved well and barrier layers. Well layers typically are of uniform thickness and composed of the same active semiconductor material. Similarly, the barrier layers typically are of uniform thickness and made of a semiconductor material different from the well layer composition. Each SCL typically is made of the same material as the barrier layers. The barrier layers typically are slightly thicker than the well layers and each SCL typically is much thicker than both the well and barrier layers.

Although LP-MOCVD is perhaps one of the most widely used growth methods for semiconductor heterostructures, it has been found that in the production of MQW lasers having output wavelengths of less than approximately 1.55 µm, the well and barrier layers produced by LP-MOCVD frequently have pronounced lateral thickness modulation. That is, the well and barrier layers are not of uniform thickness, consequently the hetero-interfaces between well and barrier layers are not well-defined.

With MQW lasers having well thicknesses less than approximately 100 Å, such as 1.48 µm pump lasers and 1.3 µm analog and digital lasers, the output wavelength depends on the thickness of the active well region much more so than other factors such as the compositional gradients of the well and barrier layers. It is with these relatively thin layers that lateral thickness modulation phenomenon and interface roughness is the most dramatic, to the point of affecting the accuracy, efficiency and ultimate performance of the MQW laser.

Although not wishing to be bound by theory, it is believed that the lateral thickness modulation of the layers is caused by pressure transients introduced into the reactor during gas switching sequences between growth stages. Also, surface atomic rearrangement occurring during growth interrupts may contribute to the lateral thickness modulation in the most recently grown layer.

Many techniques have been used in conjunction with LP-MOCVD in an attempt to reduce the effects of lateral thickness modulation. One such technique, disclosed in Japanese patent 5007053, is a hydrogen plasma pretreatment that involves using a hydrogen plasma beam to etch away irregularities on the surface of each layer prior to growth of subsequent layers. In another technique, Japanese patent 5055697, multiple barrier layers are grown on each side of the well layer to improve the overall heterostructure of the device. However, nothing in the prior art has been able to produce abrupt, well-defined heterojunctions of such high quality on a reproducible basis for MQW lasers having output wavelengths less than approximately 1.55 µm.

SUMMARY OF THE INVENTION

According to its major aspects and broadly stated, the present invention is a method for making multi-quantum well structures having superior interfacial crystalline quality. In particular, it is an LP-MOCVD crystal growth method using continuous growth stages to produce well-defined heterojunctions of uniform thickness for multi-quantum well (MQW) lasers, including MQW lasers structures having output wavelengths less than approximately 1.55 µm. The continuous growth stages are characterized by essentially instantaneous gas switching sequences from a first gaseous mixture used to grow separate confinement layers (SCL) and barrier layers to a second gaseous mixture used to grow quantum well layers. By continuous growth stages it is meant that there is no intentional pause between well and barrier layer growth stages, that is, the gaseous mixture used for a particular growth stage is introduced into the LP-MOCVD reactor just as the last of the previous gaseous mixture is venting out of the reactor. Surprisingly, it appears that the continuous growth stages of the present invention decrease the pressure transients that exist during gas switching sequences in conventional LP-MOCVD methods, thereby minimizing if not eliminating all lateral thickness modulation in the well and barrier layers by suppressing the tendency for the growth to proceed in a three dimensional manner.

DETAILED DESCRIPTION

Figure 1:
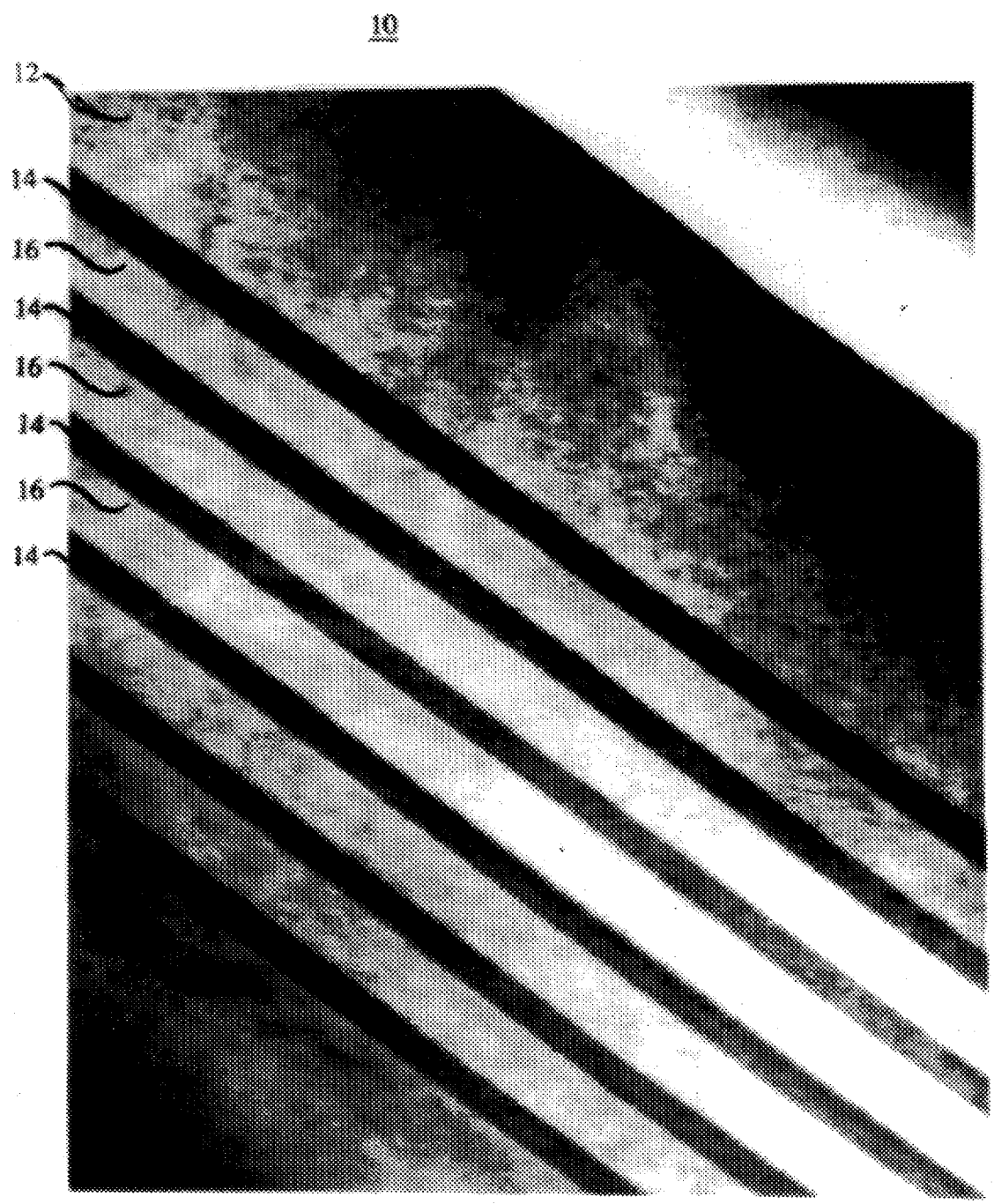
FIG. 1 is a transmission electron photomicrograph of a multi-quantum well 1.55 µm laser produced by an LP-MOCVD reactor according to a prior art method in a cross-section taken at approximately 850,000x magnification.

Referring now to FIG. 1, a magnified, cross-sectional view of the heterostructure of a multi-quantum well 1.55 µm laser 10 is shown. The laser 10 was produced with an LP-MOCVD reactor using a conventional growth process. As can be seen from this high quality structure, a separate confinement layer (SCL) 12, and a plurality of well layers 14 and barrier layers 16 interleave with abrupt, well-defined hetero-interfaces therebetween. Each layer has a substantially uniform thickness even though each type of layer is of a different thickness. By substantially uniform thickness it is meant that each layer is within approximately ±3 Å of its desired thickness. Such high quality hetero-interfaces are desired in MQW lasers to ensure a constant output wavelength, which translates into sharper, clearer light transmission from laser 10, and reduces optical and electronic losses at the interface that lower the operating efficiency of the laser device.

Figure 2:
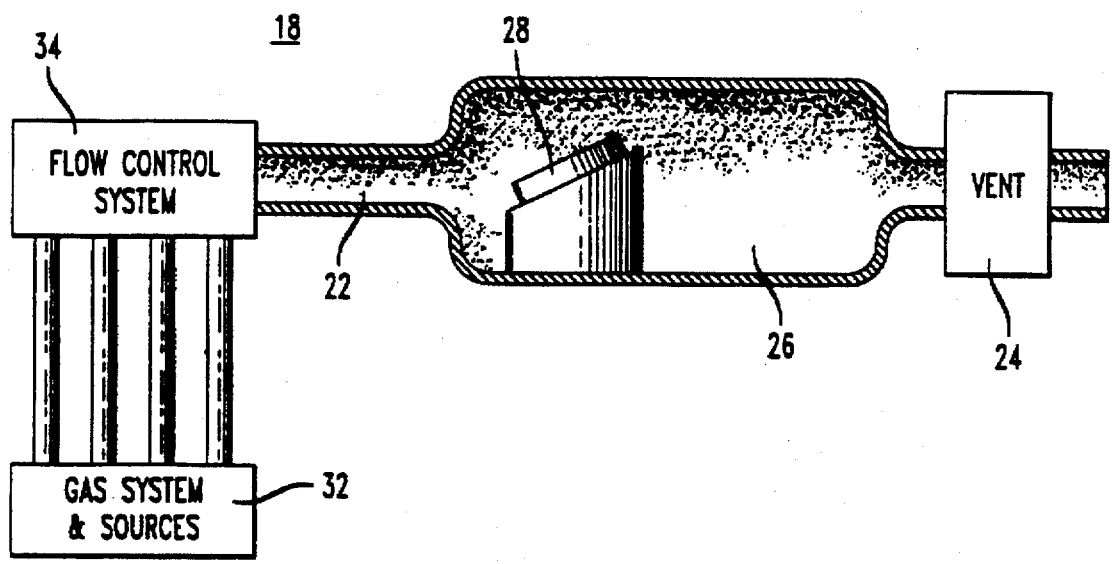
FIG. 2 is a simplified, schematic view of an LP-MOCVD reactor.

The layer structure of a multi-quantum device is grown epitaxially on a substrate within an LP-MOCVD reactor. As shown schematically in FIG. 2, a typical LP-MOCVD reactor 18 has an inlet 22, a vent 24, and an interior chamber 26 therebetween for placement of a substrate 28. For multi-quantum well structures, substrate 28 is preferably made of InP or an InP-based material. However, a variety of other materials such as GaAs, GaP, GaSb, InAs and InSb are acceptable.

A gas system 32 containing a plurality of gases and/or gaseous mixtures necessary for making the desired heterostructure is connected to chamber 26 via a flow control system 34. Flow control system 34 is connected between gas system 32 and inlet 22 of chamber 26 and controls the flow of gases into chamber 26 via a switching scheme that will be discussed in greater detail below. With LP-MOCVD reactors, special care is taken to maintain equal pressure in inlet 22 and vent 24 so that turbulence is limited in chamber 26 during gas switching sequences.

Typically, in conventional LP-MOCVD growth methods, substrate 28 is placed in chamber 26 and heated while flow control system 34 feeds gaseous mixtures from gas system 32 flowingly into chamber 26. Each particular gaseous mixture, whose constituency and flow rate depend on which of the various possible flow configurations is established by flow control system 34, flows through chamber 26 from inlet 22 to vent 24. In the presence of hydrogen, the gaseous mixtures introduced into chamber 26 are pyrolized at temperatures between approximately 600° C. and 700° C. to grow the desired semiconductor layer on substrate 28. Additional layers of similar or slightly different semiconductor materials are grown subsequently in a similar manner until the desired device heterostructure is achieved.

As mentioned previously, in producing MQW lasers, the heterostructure is characterized by a separate confinement layer (SCL) adjacent to a plurality of alternating well and barrier layers. Typically, in prior art heterostructures, the quantum well layers are made of alloys such as InGaAs, InGaAlP or InGaAsP and the barrier layers are made of III/V materials such as InGaAsP, InAlAs, InAlAsP, InGaAlP, InGaP or InP. Therefore, source gases such as trimethylgallium (TMGa), trimethylindium (TMIn), phosphine (PH$_3$) and arsine (AsH$_3$) are contained in gas system 32 for use in layer growth. See, for example, V. Swaminathan, A. T. Macrander, *Material Aspects of GaAs and InP Based Substrates*, 1991, p. 131–133. Alternatively, gas system 32 contains individual gases, for example individual sources of H, As and P. In such cases, flow control system 34 is configured accordingly to mix the gases together as required.

Typically, in LP-MOCVD reactors, a vacuum system (not shown) is tied to vent 24 and combines with flow control system 34 to cause gas entering chamber 26 to pass from inlet 22 through chamber 26 and out through vent 24. Also, gas system 32 works in concert with flow control system 34 to control the flow rates of the various gases flowing through chamber 26. In this manner, the relative concentration per unit time of the constituents in a particular gaseous mixture can be controlled.

In the specific operation of reactor 18 according to conventional methods, substrate 28 is positioned within chamber 26 and flow control system 34 is adjusted to cause a first gaseous mixture to flow through chamber 26 at a desired rate from inlet 22 to vent 24. During this first growth stage, in the presence of hydrogen and pyrolizing temperatures, vapor from the first gaseous mixture reacts at the surface of substrate 28, forming a solid on the outer surface of substrate 28 epitaxially as a single semiconductor crystal layer. The thickness of the layer inter alia depends on the duration of the growth stage and the composition of the layer depends on the particular mixture of gases introduced into chamber 26.

Next, following a brief period of growth interruption lasting approximately 3–10 seconds, flow control system 34 causes a second gaseous mixture, which differs in composition from the first gaseous mixture, to flow through chamber 26 at a desired rate from inlet 22 to vent 24. During this second growth stage, a single semiconductor crystal layer of different semiconductor material is grown epitaxially on the first semiconductor layer. Then, after another 5–6 second period of growth interruption, flow control system 34 causes the first gaseous mixture to flow through chamber 26 for growth of the next layer, as described above. As previously discussed, according to the conventional method, these alternating growth stages, separated in time by growth interruption intervals, continue until the desired heterostructure is produced.

Figure 3:
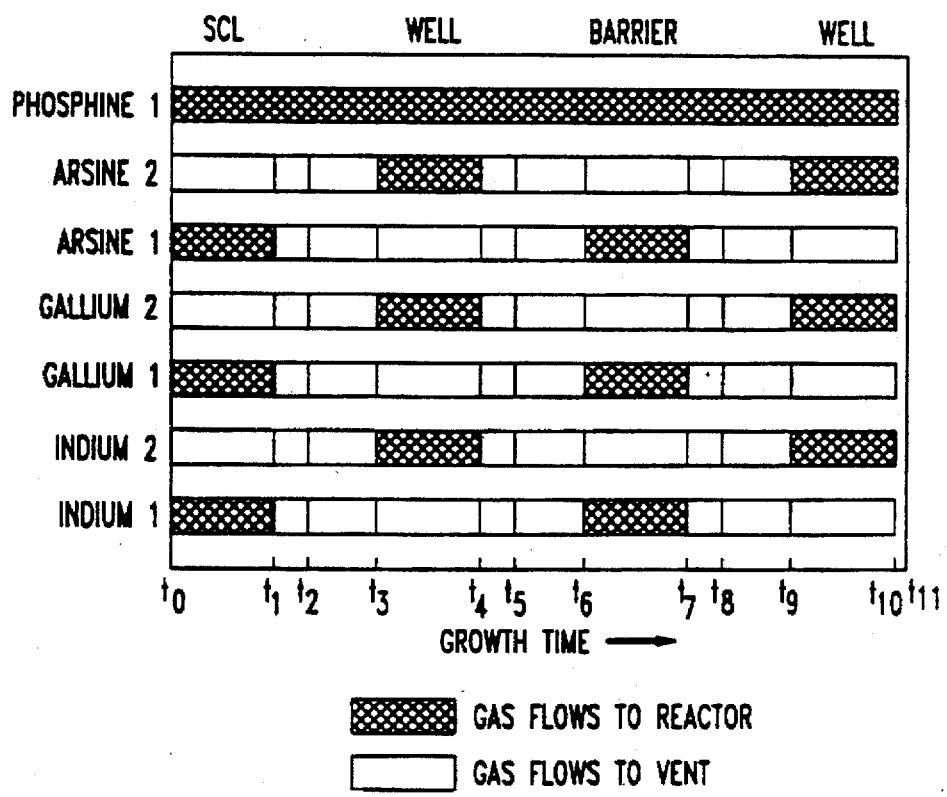
FIG. 3 is a timing chart illustrating the switching scheme of the LP-MOCVD reactor according to a prior art method.

The prior art LP-MOCVD switching scheme can be understood from the illustration of the growth timing sequence shown in FIG. 3, which was used to produce the MQW laser of FIG. 1 in a conventional LP-MOCVD system. In FIG. 3, the label PHOSPHINE 1 represents a source of phosphine (PH$_3$) that is introduced into chamber 26 throughout the entire growth process, which, for purposes of this illustration, is from $t_0$ to $t_{11}$. It should be understood that in other growth processes, phosphine is introduced into the chamber only during certain time intervals during the growth process.

Other labels for the gaseous mixtures used in the illustrated growth process include ARSINE 1 and ARSINE 2, which represent a single source of arsine that is regulated by separate controls during different time intervals by flow control system 34, thereby creating what is effectively a first arsine flow (ARSINE 1) and a second arsine flow (ARSINE 2). That is, gas system 32 has a single arsine source but, through the use of different flow rates as dictated by flow control system 34, a different concentration of arsine per unit time is introduced into chamber 26 during, say, a first growth stage compared to the concentration of arsine per unit time introduced into chamber 26 during, say, a second growth stage. Similar arrangements exist for gallium (GALLIUM 1 and 2) and indium (INDIUM 1 and 2).

As shown in FIG. 3, during the initial growth stage in the prior art method, shown as the time interval from $t_0$ to $t_1$, the separate confinement layer (SCL) is grown. Prior to $t_0$, flow control system 34 was configured to introduce the first gaseous mixture, which, in this prior art example, is composed of contributions of PHOSPHINE 1, ARSINE 1, GALLIUM 1 and INDIUM 1, into chamber 26. During this first growth stage, the first gaseous mixture is introduced into chamber 26 via inlet 22 and flows over substrate 28 toward vent 24. As discussed above, during this flow, vapor from the first gaseous mixture reacts with the surface and, as a result, forms a solid that is deposited on substrate 28 epitaxially in the form of a thin single crystal (in this case, the SCL). The thickness of the SCL is approximately 400–600 Å when complete. Determination of the duration of the growth stage is discussed in more detail below.

According to conventional LP-MOCVD methods, the subsequent time interval, from $t_1$ to $t_2$, is a growth interruption interval occurring after the first growth stage. In the prior art, this growth interruption interval is, for instance, about 1 second in duration, but can vary somewhat, depending on specific features of apparatus and process. Similarly, the next growth interruption interval, from $t_2$ to $t_3$, is a pause of, e.g., approximately 5–10 seconds selected to allow flow control system 34 to readjust thereby effectively changing its configuration from one that introduces the first gaseous mixture into chamber 26 to one that introduces the second gaseous mixture into chamber 26. As those skilled in the art know, these growth interruptions are generally deemed necessary features of the growth process, although current LP-MOCVD reactors are capable of switching gases essentially instantaneously.

It is conventionally thought that growth interruptions function to allow residue from the previous gaseous mixture enough time to clear out of chamber 26 prior to the introduction of the next gaseous mixture to avoid non-stoichiometric growth. Thus, after the SCL is grown from period $t_0$ to $t_1$, a growth interruption of approximately 6 seconds (from $t_1$ to $t_3$) occurs before the next growth stage (from $t_3$ to $t_4$) is initiated. However, although not wishing to be bound by theory, I have now come to believe that these growth interruption intervals invite surface rearrangement and increased pressure transients within chamber 26 that fail to suppress three dimensional growth of the layer surface and consequently contribute to lateral thickness modulations in the layers.

During the next growth stage, from $t_3$ to $t_4$, one of the quantum well layers 14 is grown using the second gaseous mixture. In the prior art example shown in FIG. 3, the second gaseous mixture is composed of contributions of PHOSPHINE 2, ARSINE 2, GALLIUM 2 and INDIUM 2. After quantum well layer 14 is grown to a desired thickness, another pair of growth interruption intervals occur from $t_4$ to $t_5$ and from $t_5$ to $t_6$. During these interruptions, flow control system 34 switches its configuration from one that will introduce the second gaseous mixture into chamber 26 back to one that will introduce the first gaseous mixture into chamber 26.

Then, from $t_6$ to $t_7$, one of barrier layers 16 is grown to a desired thickness using the first gaseous mixture. As illustrated, the SCL and the barrier layers are typically grown from the same gaseous mixture. Following growth interruption intervals from $t_7$ to $t_8$ and from $t_8$ to $t_9$, the next well layer 14 is grown using the first gaseous mixture. The growth stages and interruption intervals continue alternating thereafter between growing well layers 14 and barrier layers 16 in the manner just discussed and shown in FIG. 3 until the desired laser heterostructure is made.

As stated previously, prior art LP-MOCVD methods using contemporary equipment, such as the AIXTRON 200/2 reactor, usually produce satisfactory results for MQW lasers having output wavelengths of 1.55 μm and above. However, for MQW lasers having output wavelengths of less than approximately 1.55 μm, it has been found to be extremely difficult to grow such thin layers while maintaining the uniform thickness of the individual layers and the well-defined hetero-interfaces between layers.

Figure 4:
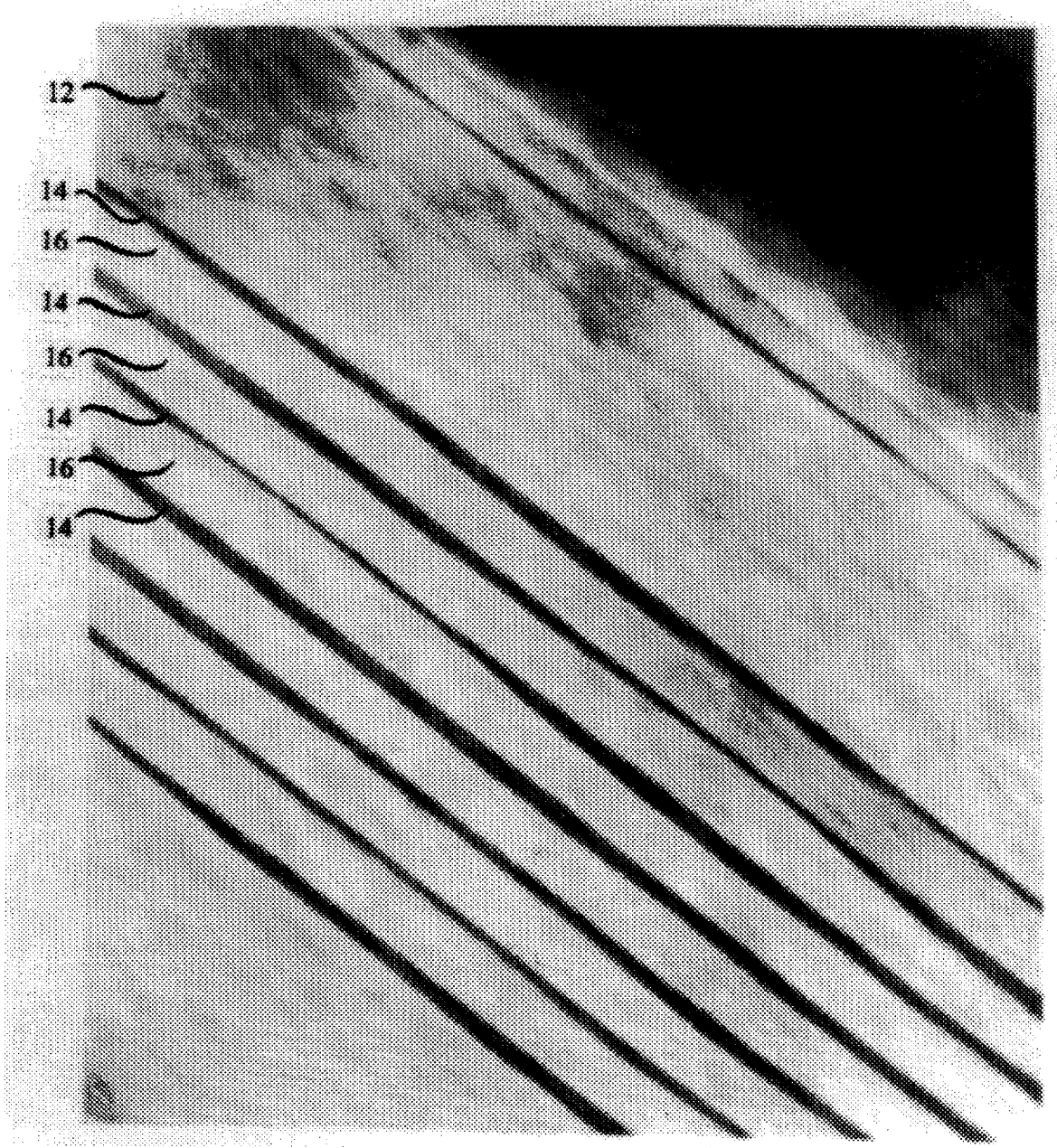
FIG. 4 is a transmission electron photomicrograph of a multi-quantum well 1.40 µm laser produced by an LP-MOCVD reactor according to a prior art method in a cross-section taken at approximately 880,000x magnification.

For example, referring now to FIG. 4, which depicts an MQW laser with a plurality of 1.40 μm InGaAsP active region well layers 14 and a corresponding plurality of 1.17 μm InGaAsP barrier layers 16 grown with the conventional LP-MOCVD method, it can be seen that the heterostructure of the laser is inferior compared to that of the laser shown in FIG. 1. Specifically, both the well layers 14 and the barrier layers 16 exhibit severe lateral thickness modulation and thus their respective thicknesses are non-uniform. As stated above, such unevenness in the heterostructure, particularly in the active well regions where light is transmitted therethrough, causes inconsistent output wavelengths and reduces the efficiency and performance standard of the laser.

Figure 5:
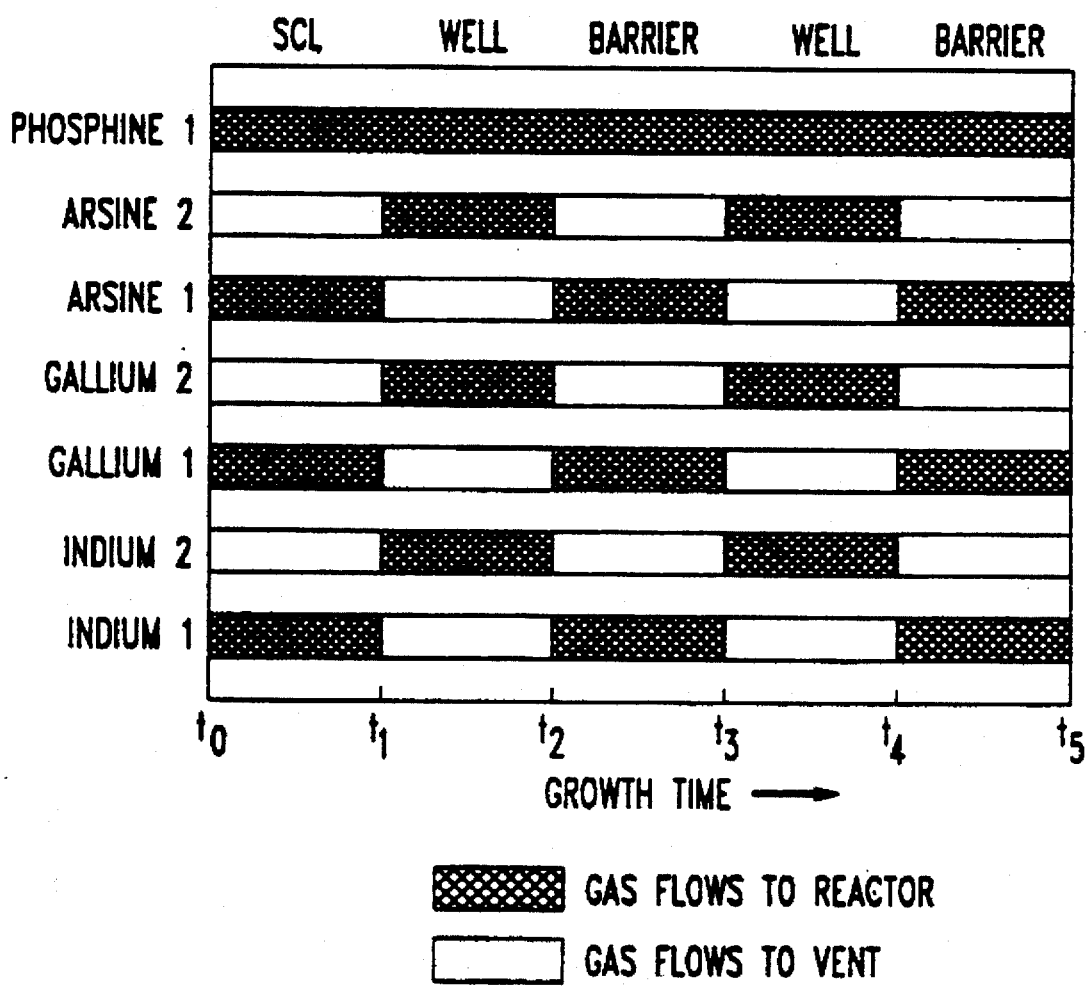
FIG. 5 is a timing chart illustrating the switching scheme of the LP-MOCVD reactor according to an embodiment of the present invention.
Figure 6:
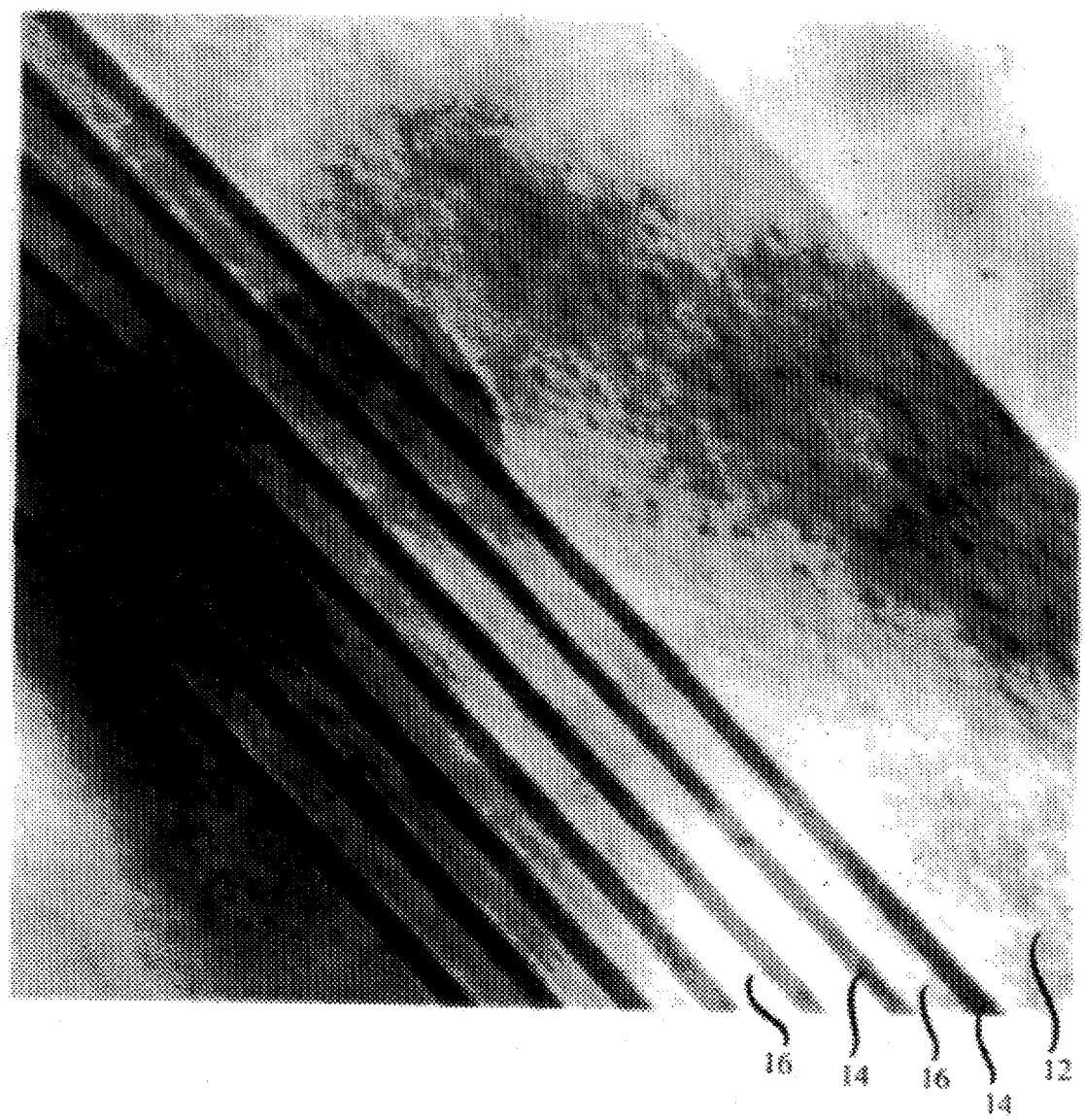
FIG. 6 is a transmission electron photomicrograph of a multi-quantum well 1.30 µm laser produced by an LP-MOCVD reactor according to an embodiment of the present invention in a cross-section taken at approximately 860,000x magnification.

Referring now to FIGS. 5–6, one embodiment of the present invention is depicted schematically in FIG. 5 and a transmission electron photomicrograph displaying the results in FIG. 6. However, depending on the structure desired and its particular heterostructure, it is within the scope of this inventive technique to use gaseous mixtures other than those illustrated in FIG. 5.

As can be seen in FIG. 5, the SCL is grown from $t_0$ to $t_1$ using a first gaseous mixture containing contributions of PHOSPHINE 1, ARSINE 1, GALLIUM 1 and INDIUM 1 in a manner similar to the prior art method previously described. Specifically, the first gaseous mixture, which contains trimethylgallium (TMGa), trimethylindium (TMIn), 100% arsine (AsH$_3$) & 100% phosphine (P$_{H3}$), was introduced into chamber 26 and, in the presence of hydrogen and pyrolizing temperatures of approximately 670° C., a single thin layer of InGaAsP was formed epitaxially on substrate 28. This first stage was performed until the thickness of the SCL was approximately 450 Å. The waste gases not used to form the SCL were vented from chamber 26 through vent 24.

Upon completion of this first growth stage (at time $t_1$), the second growth stage was initiated by introducing the second gaseous mixture into chamber 26. Unlike the prior art, the inventive technique described herein does not undergo any growth interruption intervals between growth stages. As such, the second growth stage (growth of the first well layer 14) began immediately after completion of the first growth stage (at time $t_1$) and continued until time $t_2$. As shown, the second gaseous mixture for the second growth stage contained contributions of PHOSPHINE 2, ARSINE 2, GALLIUM 2 and INDIUM 2.

As described previously, the gas switching sequence is a function of the particular flow control system 34 of the LP-MOCVD reactor 18 in use. It is known in the art that contemporary LP-MOCVD reactors have flow control systems capable of switching flow configurations essentially instantaneously. Thus, in the inventive technique described herein, the elimination of the growth interruption intervals coupled with the essentially instantaneous switching scheme combines to produce what is effectively a continuous growth process having a plurality of continuous growth stages. It is to be understood that the terms "instantaneous," "essentially instantaneous" and "continuous" are defined as having no (intentionally practical)identifiable time interval for example, between growth stages or between gas flow switching operations. Furthermore, it is to be understood that the term "continuous growth stages" is defined as having no intentionally identifiable growth interruption time interval between growth stages.

From an equipment standpoint, standard LP-MOCVD reactors are capable of performing abrupt transitions in the composition of the gaseous mixtures introduced into the reactor chamber. However, despite having knowledge of such instantaneous switching capabilities, prior art LP-MOCVD methods continue to make use of identifiable growth interruption intervals between growth stages.

As clearly shown in FIG. 5, upon completion of the first growth stage (at time $t_1$), the growth of the first well layer 14 begins immediately at time $t_1$ and continues to time $t_2$. Upon completion of this growth stage at time $t_2$, growth of the barrier layer 16 begins immediately at time $t_2$ with the first gaseous mixture, which was also used to grow the SCL. This growth stage lasts from $t_2$ to $t_3$, upon which time the growth stage for next well layer 14 begins, again with the gaseous mixture that was used to grow the first well layer. This well layer 14 is grown from $t_3$ to $t_4$, and then the growth stage for the next barrier layer 16 occurs from $t_4$ to $t_5$. This alternating pattern of continuous growth stages is repeated until the desired heterostructure is produced.

In the present invention, well layers were grown to a thickness of no more than 30 Å and barrier layers were grown to a thickness of approximately 90 Å. Therefore, using conventional growth rates of approximately 10 Å/per sec for quaternary layers such as InGaAsP, the duration of well growth stages was approximately 3.0 seconds and the duration of barrier growth stages was approximately 9.0 seconds. As expected, the duration of the growth stage for the 450 Å SCL was much longer, approximately 45.0 seconds. Also, the pyrolizing temperature during the growth stages was approximately 670° C., and the growth pressure was approximately 80 mbar (60 torr).

As discussed, the inventive technique described herein does not allow any growth interruption intervals, which, as stated previously, are used to allow gas from the previous growth period time to clear out of chamber 26 prior to the introduction of gas from the next growth period. Thus, in actual practice, the immediate transition from one growth stage to the next means that the introduction of a gaseous mixture into chamber 26 for a particular growth stage begins before all of the gas from the previous growth stage has cleared out of chamber 26. Accordingly, in the context of the inventive technique described herein, it is to be understood that the term "immediately" is defined as introducing a new gaseous mixture into chamber 26 thus initiating a new growth stage prior to the complete removal from chamber 26 of the previous gaseous mixture from the previous growth stage.

Although, according to conventional reasoning, the instantaneous gas switching scheme characteristic of the present invention is expected to yield heterostructures of inferior quality, due to the likely existence of non-stoichiometric gas ratios during stages of the growth, this inventive technique produces surprising results that would not be expected. Although not wishing to be bound by theory, it is believed that the inventive technique described herein actually decreases pressure transients within chamber 26 that would otherwise increase during the time intervals between gas switching operations and eliminates surface re-ordering, thus suppressing three dimensional growth of the surface of the outer layer to the extent that the thickness of the most recently grown layer remains uniform.

Referring again to FIG. 6, a magnified, partial cross-section of a 1.3 μm MQW laser produced by the inventive technique described herein is shown. As can be seen, the interfacial structure of the laser is characterized by smooth, well-defined hetero-interfaces between each of layers. Also, each layer is substantially of uniform thickness, that is, within approximately ±3 Å. Such results are comparable to the heterostructure of the laser shown in FIG. 1 and represent a dramatic improvement over the inferior heterostructure shown in FIG. 4.

It will be apparent to those skilled in the art that many changes and substitutions can be made to the preferred embodiment herein described without departing from the spirit and scope of the present invention as defined by the appended claims.

What is claimed is:

1. A method for making a quaternary quantum well laser device, said method for use with a chamber having a gas system in fluid connection therewith, said method comprising the steps of:

introducing a gaseous mixture into said chamber to epitaxially grow a first semiconductor layer on a semiconductor substrate positioned within said chamber; and varying the flow rate of more than one of the gases in said gaseous mixture so as to grow a second semiconductor layer on said first semiconductor layer, wherein said second semiconductor layer is grown epitaxially on said first semiconductor layer substantially without growth interruption there between.

2. The method as recited in claim 1, wherein said chamber further comprises a first end and a second end in spaced relation to said first end, wherein said introducing step further comprises flowing a first gaseous mixture into said chamber through said first end and out of said chamber through said second end, and wherein said varying step further comprises introducing a second gaseous mixture into said first end of said chamber prior to said first gaseous mixture flowing out of said second end.

3. The method as recited in claim 1, wherein said gas system further comprises a first flow configuration for producing a first gaseous mixture and a second flow configuration for producing a second gaseous mixture, and wherein said varying step further comprises changing the configuration of said gas system instantaneously from said first configuration to said second configuration.

4. The method as recited in claim 3, wherein said varying step further comprises varying the flow rate continuously between said first and second flow configurations in such a way that a plurality of first and second semiconductor layers are formed interleavingly on said semiconductor substrate.

5. The method as recited in claim 1, wherein said gaseous mixture includes precursor compounds for growth of InGaAsP.

6. The method as recited in claim 1, wherein said introducing step further comprises introducing said gaseous mixture into said chamber so that a first semiconductor layer is grown epitaxially on an InP-based semiconductor substrate.

7. The method as recited in claim 1, wherein at least one of said semiconductor layers is grown to a thickness of no more than approximately 30 Angstroms.

8. A method for making a InGaAsP multi-quantum well laser having an output wavelength less than approximately 1.55 μm, said method for use with a chamber having a gas system in fluid connection therewith, said gas system having a first flow configuration for producing a first gaseous mixture and a second flow configuration for producing a second gaseous mixture, said method comprising the steps of:

configuring said gas system to said first flow configuration;

introducing said first gaseous mixture into said chamber to grow a first semiconductor layer epitaxially on a semiconductor substrate positioned within said chamber, said first introducing step further comprising a first growth stage;

configuring said gas system to said second configuration by varying a plurality of the flow rates of the gases in said gas system from said first flow configuration in such a way that no more than one flow rate remains substantially constant;

introducing said second gaseous mixture into said chamber to grow a second semiconductor layer epitaxially on said first semiconductor layer, said second introducing step further comprising a second growth stage; and repeating said first configuring step, said first introducing step, said second configuring step and then said second introducing step continuously to grow a plurality of interleaving layers of said multi-quantum well laser, said configuring steps configuring said gas system so as to introduce said respective gaseous mixtures into said chamber substantially with interruption between growth stages.

9. The method as recited in claim 8, wherein said configuring steps further comprise changing the configuration of said gas system instantaneously whereby said repeated introducing steps form a plurality of continuous growth stages.

10. The method as recited in claim 8, wherein said first and second gaseous mixtures include precursor compounds for growth of InGaAsP, wherein first introducing step further comprises introducing said first gaseous mixture into said first end of said chamber at a first flow rate, and wherein said second introducing step further comprises introducing said second gaseous mixture into said first end of said at a second flow rate, said first and said second flow rates differing from each other.

11. The method as recited in claim 8, wherein said first introducing step further comprises introducing said first gaseous mixture into said chamber so that a first semiconductor layer is grown epitaxially on an InP-based semiconductor substrate.

12. The method as recited in claim 8, wherein said first introducing step further comprises growing said first semiconductor layer to a thickness of no more than approximately 30 Angstroms and wherein said second introducing step further comprises growing said second semiconductor layer to a thickness of approximately 90 Angstroms.

13. The method as recited in claim 8, wherein said method further comprises the step of introducing phosphine into said chamber at a preselected flow rate during said configuring steps, said introducing steps, and said repeating step.

14. A method for making a InGaAsP multi-quantum well laser having an output wavelength less than approximately 1.55 μm, said method for use with an LP-MOCVD reactor having a first end, a gas system in fluid connection therewith, and a second end in spaced relation to said first end, said gas system having a first flow configuration for producing a first gaseous mixture and a second flow configuration for producing a second gaseous mixture, said method comprising the steps of:

configuring said gas system to said first flow configuration;

introducing said first gaseous mixture into said reactor in such a way that said first gaseous mixture flows through said first end and out of said reactor through said second end, said first gaseous mixture passing over an InP-based substrate positioned within said reactor to grow a first semiconductor layer epitaxially on said InP-based semiconductor substrate, said first gaseous mixture including indium, gallium, arsine and phosphine;

configuring said gas system to said second configuration by varying the flow rates of all gases but phosphine in said gas system from those of said first flow configuration;

introducing said second gaseous mixture into said reactor prior to said first gaseous mixture passing out of said second end, said second gaseous mixture flowing into said reactor through said first end, over said InP-based substrate and out of said reactor through said second end to grow a second semiconductor layer epitaxially on said first semiconductor layer; and repeating said first configuring step, said first introducing step, said second configuring step and then said second introducing step continuously to grow a plurality of interleaving layers of said multi-quantum well laser, said configuring steps configuring said gas system so as to introduce said respective gaseous mixtures into said reactor substantially without interruption therebetween.

15. The method as recited in claim 14, wherein said first introducing step further comprises a first growth stage, wherein said second introducing step further comprises a second growth stage, and wherein said configuring steps further comprise changing the configuration of said gas system instantaneously whereby said repeated introducing steps form a plurality of continuous growth stages.

16. The method as recited in claim 14, wherein said first and second gaseous mixtures include precursor compounds for growth of InGaAsP, wherein first introducing step further comprises introducing said first gaseous mixture into said first end of said reactor at a first flow rate, and wherein said second introducing step further comprises introducing said second gaseous mixture into said first end of said at a second flow rate, said first and said second flow rates differing from each other.

17. The method as recited in claim 14, wherein said first introducing step further comprises growing said first semiconductor layer to a thickness of no more than approximately 30 Angstroms and wherein said second introducing step further comprises growing said second semiconductor layer to a thickness of approximately 90 Angstroms.

18. The method as recited in claim 14, wherein said method further comprises the step of introducing phosphine into said reactor at a preselected flow rate during said configuring steps, said introducing steps, and said repeating step.

* * * * *